(12) United States Patent
Hurlbert et al.

(10) Patent No.: US 8,584,738 B2
(45) Date of Patent: Nov. 19, 2013

(54) APPARATUS AND METHOD FOR EXTRACTING HEAT FROM A DEVICE

(75) Inventors: Kathryn M. Hurlbert, Seabrook, TX (US); Warren Ruemmele, Houston, TX (US); Hai D. Nguyen, League City, TX (US); Kambiz K. Andish, Houston, TX (US); Sean M. McCalley, Allen, TX (US)

(73) Assignee: Lockheed Martin Corporation, Grand Prairie, TX (US)

( * ) Notice: Subject to any disclaimer, the term of this patent is extended or adjusted under 35 U.S.C. 154(b) by 2836 days.

(21) Appl. No.: 10/172,662

(22) Filed: Jun. 14, 2002

(65) Prior Publication Data

US 2003/0230399 A1 Dec. 18, 2003

(51) Int. Cl.
*F28F 3/12* (2006.01)
*F28F 7/00* (2006.01)

(52) U.S. Cl.
USPC .......................................... 165/80.4; 165/168

(58) Field of Classification Search
USPC ............... 165/80.4, 168–171, 49, 56, 104.33, 165/185; 361/699, 711, 724, 702; 29/890.038; 420/417, 419; 228/140, 228/183, 251, 262.72
See application file for complete search history.

(56) References Cited

U.S. PATENT DOCUMENTS

| | | | | |
|---|---|---|---|---|
| 2,663,551 A * | 12/1953 | Boling | ............................. | 165/68 |
| 2,799,481 A * | 7/1957 | Becker | ........................... | 165/171 |
| 3,024,606 A * | 3/1962 | Adams et. al. | ................... | 60/267 |
| 4,291,546 A * | 9/1981 | Rodth | ............................. | 62/398 |
| 4,383,346 A * | 5/1983 | Bochinski et al. | ........ | 15/104.061 |
| 4,478,277 A * | 10/1984 | Friedman et al. | ............. | 165/185 |
| 4,975,803 A | 12/1990 | Niggemann | ................... | 361/385 |
| 5,088,005 A | 2/1992 | Ciaccio | ......................... | 361/385 |
| 5,099,311 A * | 3/1992 | Bonde et al. | ................. | 165/80.4 |
| 5,114,635 A * | 5/1992 | Sohda et al. | .................. | 264/29.2 |
| 5,152,337 A | 10/1992 | Kawakatsu et al. | ............ | 165/153 |
| 5,205,348 A * | 4/1993 | Tousignant et al. | ............ | 165/46 |
| 5,254,396 A * | 10/1993 | Takemura et al. | ............ | 442/241 |
| 5,275,237 A * | 1/1994 | Rolfson et al. | ................ | 165/80.5 |
| 5,470,431 A | 11/1995 | Okuda et al. | ................. | 159/28.6 |
| 5,484,015 A * | 1/1996 | Kyees | ............................. | 165/168 |
| 5,509,472 A | 4/1996 | Tamura et al. | ................. | 165/171 |
| 5,614,164 A * | 3/1997 | Sumner et al. | ............. | 423/447.4 |
| 5,667,168 A * | 9/1997 | Fluegel | ..................... | 244/117 A |
| 5,800,673 A | 9/1998 | Okuda et al. | ................. | 159/28.6 |
| 5,812,372 A * | 9/1998 | Galyon et al. | ................ | 361/699 |
| 5,829,516 A * | 11/1998 | Lavochkin | .................... | 165/80.4 |
| 5,859,763 A * | 1/1999 | Nam et al. | ..................... | 361/699 |
| 5,896,271 A * | 4/1999 | Jensen et al. | ................... | 361/719 |
| 5,960,861 A | 10/1999 | Price et al. | ................... | 165/80.3 |
| 6,031,751 A * | 2/2000 | Janko | ............................. | 363/144 |
| 6,042,315 A * | 3/2000 | Miller et al. | .................. | 411/411 |

(Continued)

*Primary Examiner* — Tho V Duong
(74) *Attorney, Agent, or Firm* — Slater & Matsil, L.L.P.

(57) ABSTRACT

A cold plate includes a face sheet comprising a composite material and having a lower surface and at least one cooling tube attached to the lower surface and being capable of transmitting a cooling fluid therethrough. A heat extraction system includes a cold plate comprising a face sheet comprising a composite material and having a lower surface and at least one cooling tube attached to the lower surface and being capable of transmitting a cooling fluid therethrough. The heat extraction system further includes a pump in fluid communication with the cold plate and a heat exchanger in fluid communication with the pump and the cold plate. A method for fabricating a cold plate includes providing a face sheet comprising a composite material and attaching at least one cooling tube to a lower surface of the face sheet.

77 Claims, 4 Drawing Sheets

(56) References Cited

U.S. PATENT DOCUMENTS

| | | | |
|---|---|---|---|
| 6,058,010 A | 5/2000 | Schmidt et al. | 361/689 |
| 6,169,658 B1 | 1/2001 | Arena et al. | 361/704 |
| 6,191,945 B1 | 2/2001 | Belady et al. | 361/704 |
| 6,230,791 B1 | 5/2001 | Van Dine et al. | 165/80.4 |
| 6,305,463 B1 * | 10/2001 | Salmonson | 165/80.3 |
| 6,311,510 B1 * | 11/2001 | Sunama et al. | 62/268 |
| 6,351,381 B1 * | 2/2002 | Bilski et al. | 361/695 |
| 6,367,683 B1 * | 4/2002 | Rass et al. | 228/121 |
| 6,536,510 B2 * | 3/2003 | Khrustalev et al. | 165/104.33 |
| 6,536,516 B2 * | 3/2003 | Davies et al. | 165/170 |
| 6,711,017 B2 * | 3/2004 | Kurokawa et al. | 361/699 |
| 6,907,920 B2 * | 6/2005 | Warburton et al. | 165/168 |
| 2003/0100239 A1 * | 5/2003 | Gaffney et al. | 442/354 |

* cited by examiner

APPARATUS AND METHOD FOR EXTRACTING HEAT FROM A DEVICE

The U.S. Government has a paid-up license in this invention and the right in limited circumstances to require the patent owner to license others on reasonable terms as provided for by the terms of contract number NAS9-19100 awarded by the National Aeronautics and Space Administration.

BACKGROUND OF THE INVENTION

1. Field of the Invention

This invention generally relates to a method and apparatus for extracting heat from a device and, in particular, to a cold plate and methods of using and fabricating the cold plate.

2. Description of the Related Art

As the designs of equipment in general, and electronic equipment in particular, have evolved over the years, the amount of heat produced by such equipment has increased. For example, some of today's microprocessors operate at speeds that are orders of magnitude greater than their predecessors of a decade ago. Modern equipment also bundles multiple microprocessors, along with higher output power supplies and other devices, to provide ever-increasing levels of computing power. Along with the increase in computing power generally comes an increase in the amount of heat produced by the equipment and other related devices. This problem also arises with other types of electronics and electronic equipment.

Generally, excessive heat may be detrimental to the operation of such equipment. Excessive temperatures may physically damage some equipment components. In computing equipment, excessive heat may cause the equipment to provide erroneous results or may cause the equipment to fail altogether. Therefore, it is desirable in many situations to remove heat from such equipment.

Fans have been traditionally used to reduce the operating temperature of equipment. Generally, heat is removed from the equipment's components by forcing air over the components. Heat is transferred from the components to the air and the air is expelled from the equipment, often into the surrounding atmosphere. While inexpensive, this method of cooling may be inefficient from a heat transfer perspective and, thus, may not be able to remove an acceptable amount of heat from the equipment.

Other types of heat exchangers have been used to remove heat from equipment. For example, one or more cold plates may be attached directly to the equipment. Generally, cold plates operate by transferring heat from the equipment to which they are attached to a cooling fluid circulating through the cold plate or by removing heat from the equipment through the use of a thermoelectric device. Conventional cold plates typically are made of high thermal conductivity metals, such as copper or aluminum, and may be heavier than desirable in some weight-sensitive applications. Further, conventional cold plates are generally not used as part of equipment structure or to support equipment, as they are not designed to have significant structural strength for such applications.

The present invention is directed to overcoming, or at least reducing, the effects of one or more of the problems set forth above.

SUMMARY OF THE INVENTION

In one aspect of the present invention, a cold plate is provided. The cold plate includes a face sheet comprising a composite material and having a lower surface and at least one cooling tube attached to the lower surface and being capable of transmitting a cooling fluid therethrough.

In another aspect of the present invention, a cold plate is provided. The cold plate includes a face sheet having a lower surface, at least one flow tube attached to the lower surface of the face sheet capable of transmitting a cooling fluid therethrough, and a structural member attached to the face sheet.

In yet another aspect of the present invention, a heat extraction system is provided. The heat extraction system includes a cold plate comprising a face sheet comprising a composite material and having a lower surface and at least one cooling tube attached to the lower surface and being capable of transmitting a cooling fluid therethrough. The heat extraction system further includes a pump in fluid communication with the cold plate and a heat exchanger in fluid communication with the pump and the cold plate.

In another aspect of the present invention, a heat extraction system is provided. The heat extraction system includes a cold plate comprising a face sheet having a lower surface, at least one flow tube attached to the lower surface of the face sheet, and a structural member attached to the face sheet. The heat extraction system further includes a pump in fluid communication with the cold plate and a heat exchanger in fluid communication with the pump and the cold plate.

In yet another aspect of the present invention, a method for cooling an article is provided. The method includes placing the article onto a cold plate, transferring heat from the article via a composite face sheet within the cold plate, and transferring heat from the plurality of fibers to a cooling fluid flowing through the cold plate.

In another aspect of the present invention, a method for cooling an article is provided. The method includes shelving the article on a cold plate and transmitting heat from the article into a cooling fluid flowing through the cold plate.

In another aspect of the present invention, a method for fabricating a cold plate is provided. The method includes providing a face sheet comprising a composite material and attaching at least one cooling tube to a lower surface of the face sheet.

In yet another aspect of the present invention, a method for fabricating a cold plate is provided. The method includes providing a face sheet, attaching at least one cooling tube to a lower surface of the face sheet, and attaching a structural member to the face sheet.

In another aspect of the present invention, an equipment rack is provided. The equipment rack includes a cold plate and a framework for holding the cold plate as a shelf.

BRIEF DESCRIPTION OF THE DRAWINGS

The invention may be understood by reference to the following description taken in conjunction with the accompanying drawings, in which the leftmost significant digit(s) in the reference numerals denote(s) the first figure in which the respective reference numerals appear, and in which.

Figure 1:
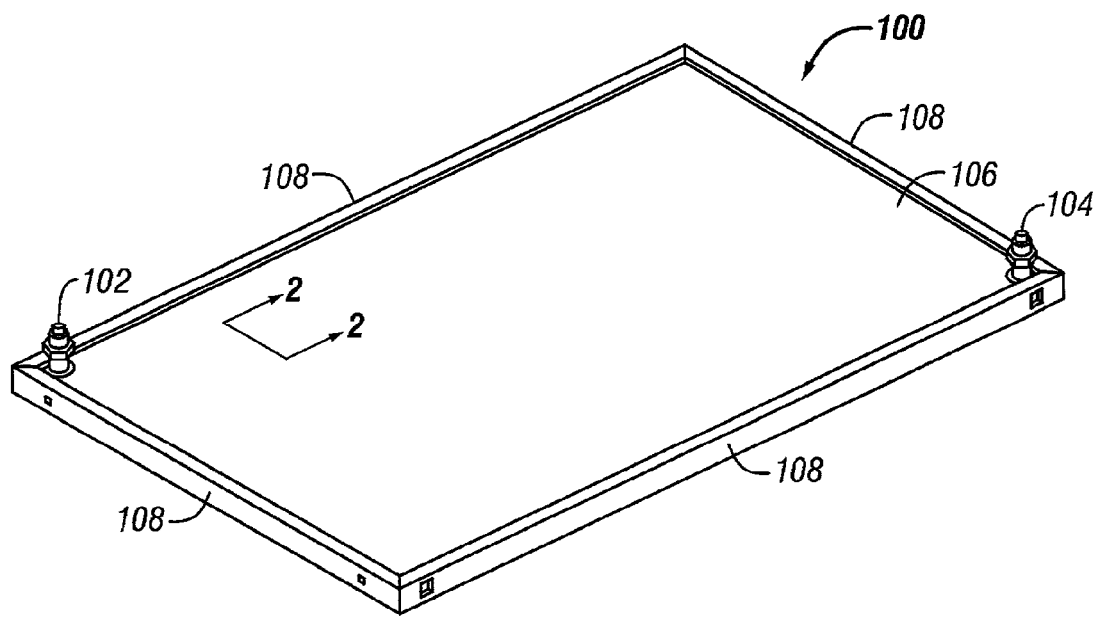
FIG. 1 is a perspective view of a cold plate according to the present invention.

While the invention is susceptible to various modifications and alternative forms, specific embodiments thereof have been shown by way of example in the drawings and are wherein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION OF SPECIFIC EMBODIMENTS

Illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort, even if complex and time-consuming, would be a routine undertaking for those of ordinary skill in the art having the benefit of this disclosure.

Figure 2:
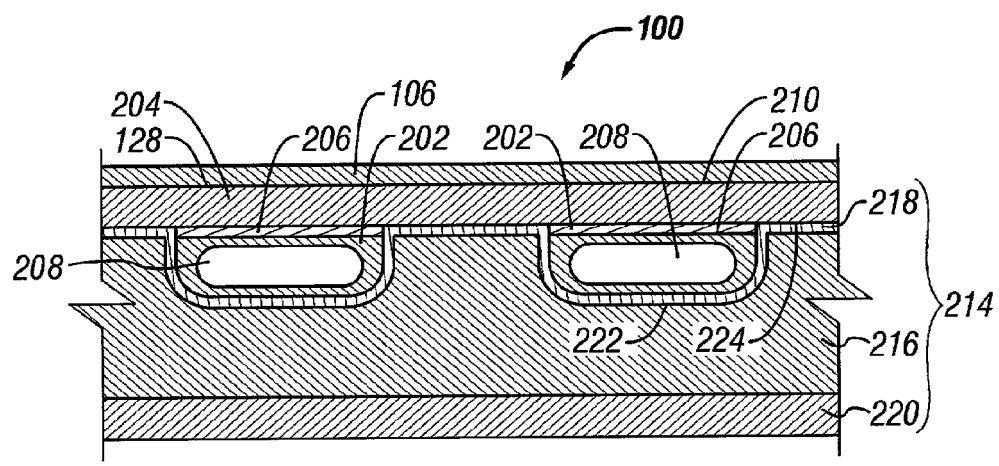
FIG. 2 is a cross-sectional view of the cold plate of FIG. 1 taken along the line III-III in FIG. 1.
Figure 3:
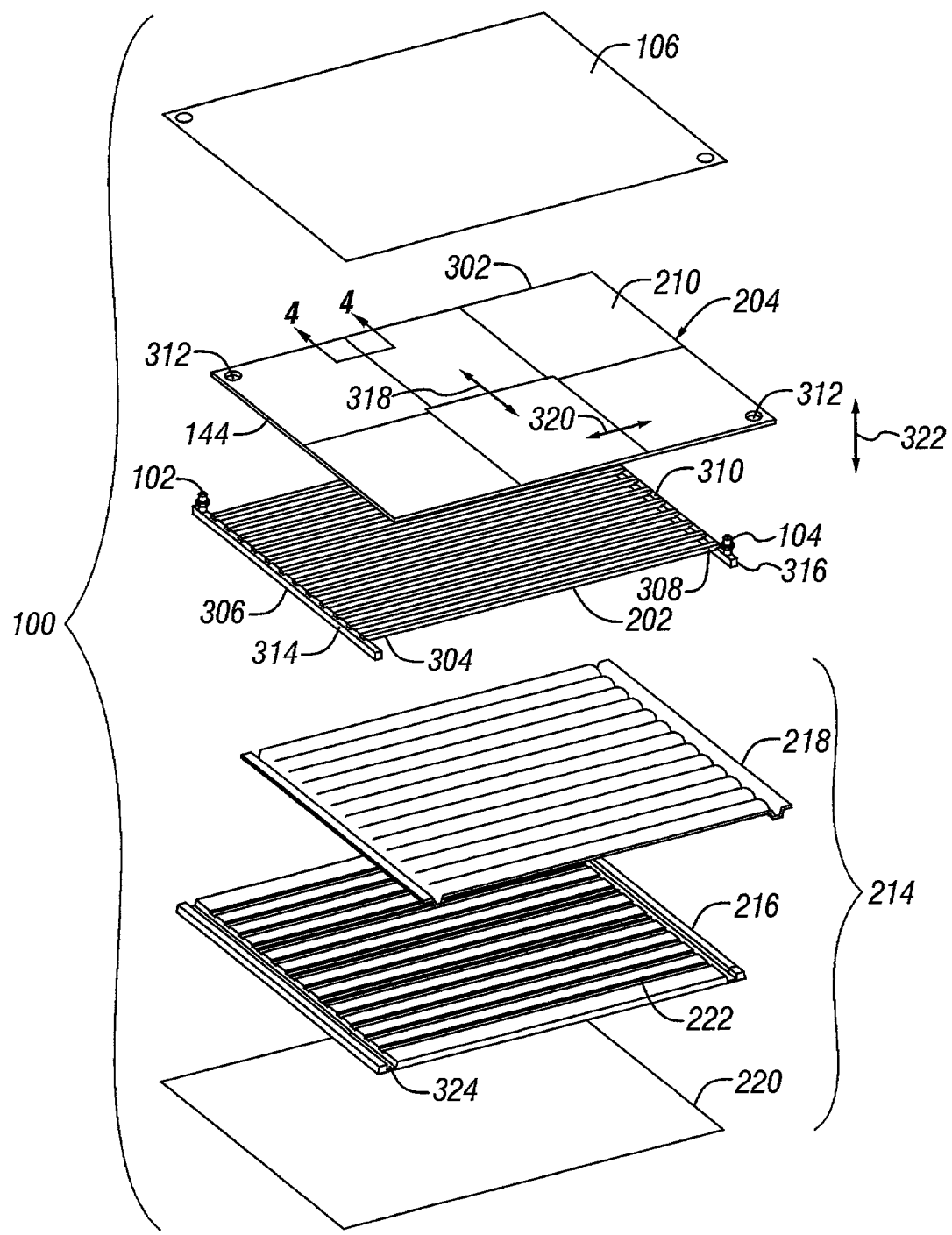
FIG. 3 is an exploded, perspective view of the cold plate of FIG. 1.
Figure 4:
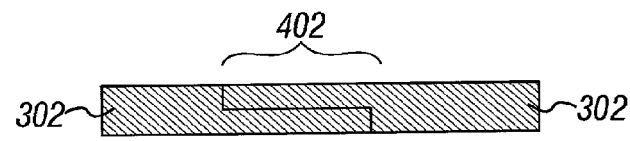
FIG. 4 is a cross-sectional view of the face sheet of FIG. 3 taken along the line IV-IV in FIG. 3.

FIGS. 1-3 illustrate an embodiment of a cold plate 100 according to the present invention. FIG. 1 depicts the assembled cold plate 100, while FIGS. 2 and 3 show the cold plate 100 in cross-section and in an exploded view, respectively. The cold plate 100 includes one or more flow tubes 202 (only one indicated) attached to a face sheet 204. The face sheet 204 may comprise one contiguous piece or may be made of a plurality of panels 302 (only one indicated) that are joined together. In one embodiment, the plurality of panels 302 are joined by lap joints 402, as illustrated in cross-section in FIG. 4. The plurality of panels 302 may be joined by any known method using a thermally conductive joining material, such as brazing, soldering, or adhesive bonding. In one embodiment, the plurality of panels are joined by a soldering process operating at a temperature of about 232° C. to about 260° C. using a solder composition not exceeding about 93% tin by weight, about 6% silver by weight, and about 4.5% titanium by weight, such as the S-Bond™ process by Materials Resources International of Landsdale, Pa. In certain embodiments, the solder may include other components, such as gallium and cerium, in concentrations not exceeding about 0.2% by weight. The face sheet 204 may be made of any thermally conductive material known in the art, e.g., copper, aluminum, carbon, polymer-matrix composite material, metal-matrix composite material, carbon-carbon composite material, metal-encapsulated carbon material, or the like.

Returning to FIG. 3, in applications wherein the weight of the cold plate 100 is of little concern, the material comprising the face sheet 204 may be selected based upon cost and thermal conductivity. Thus, in such applications, copper or aluminum may be used. In other situations, however, the weight of the cold plate 100 may be of great importance, such as in aerospace applications. In these situations, lighter-density materials, such as composite materials (e.g., polymer-matrix, metal-matrix, carbon-carbon, or metal-encapsulated carbon composite materials) may be used. In one embodiment, the face sheet 204 is made of a lightweight, high thermal conductivity, composite material having a plurality of substantially uniformly aligned petroleum pitch-based carbon fibers, e.g., ThermalGraph 6000X®, ThermalGraph 7000X® or ThermalGraph 8000X®, manufactured by Amoco Performance Products of Alpharetta, Ga. The face sheet 204 may also be made of an aluminum-encapsulated thermal pyrolytic graphite material, such as TC1050, manufactured by Advanced Ceramics Corporation of Lakewood, Ohio.

Referring to FIG. 3, the flow tubes 202 are interconnected at an input end 304 of each of the flow tubes 202 by an input manifold 306 and at an output end 308 of each of the flow tubes 202 by an output manifold 310. In use, a cooling fluid of any suitable type known to the art is introduced through an input fitting 102 and flows through the input manifold 306, the flow tubes 202, and the output manifold 310 before exiting through an output fitting 104. The scope of the present invention encompasses any desired input and output fittings (e.g., the fittings 102, 104) or omitting one or both of the fittings 102, 104 altogether. For example, manifolds 306, 310 may be directly fluidly coupled to other equipment, such as a heat exchanger (not shown in FIGS. 1-3) rather than being fluidly coupled to the other equipment via the fittings 102, 104.

In the illustrated embodiment, the face sheet 204 defines openings 312 so that, when assembled, the input fitting 102 and the output fitting 104 may protrude through the face sheet 204 for coupling with other equipment. However, the invention is not so limited and the openings 312 may be omitted in some embodiments. For example, the fittings 102, 104 may be fluidly coupled with the manifolds 306, 310 through sidewalls 314, 316 thereof, respectively.

Returning to FIG. 2, the flow tubes 202 may be attached to the face sheet 204 by any known method using a thermally conductive joining material 206, such as brazing, soldering, or adhesive bonding. In one embodiment, the flow tubes 202 are attached to the face sheet 204 by a soldering process operating at a temperature of about 232° C. to about 260° C. using a solder composition not exceeding about 93% tin by weight, about 6% silver by weight, and about 4.5% titanium by weight. In certain embodiments, the solder may include other components, such as gallium and cerium, in concentrations not exceeding about 0.2% by weight.

While the flow tubes 202 may be of any shape, FIG. 2 depicts the flow tube 202 as being generally D-shaped in cross-section and defining a bore 208 therethrough. The cross-sectional shape of the flow tube 202 is not so limited, however, and may be any desired shape, such as oval, rectangular, or rounded rectangular. The bore 208 may, in one embodiment, have a cross-sectional width-to-height aspect ratio of about 3 to about 1. The flow tubes 202, the manifolds 306, 310, and the fittings 102, 104 may be made of any known material compatible with the cooling fluid used. In one embodiment, the flow tubes 202, the manifolds 306, 310, and the fittings 102, 104 are made from stainless steel.

Referring again to FIG. 3, the face sheet 204 may have anisotropic thermal conductivity properties, depending upon the material used. For example, many carboncarbon composite materials, e.g., the ThermalGraph materials, comprise carbon fibers that are generally unidirectionally oriented. Thermal conductivity is, in general, markedly greater in directions that parallel the fibers (generally known as the longitudinal direction of the material as indicated by arrow 318) as compared to other directions, e.g., the transverse direction (as indicated by arrow 320) or the through-thickness direction (as indicated by arrow 322) of the material. For example, the longitudinal thermal conductivity of the ThermalGraph 8000X® material is at least about 550 W/mK, while the transverse and through-thickness thermal conductivity of the material is at least about 20 W/mK.

Still referring to FIG. 3, it is generally desirable, although not required, to orient the panel 204 such that the longitudinal direction (indicated by the arrow 318) of the panel 204 is generally perpendicular to, or at least not parallel with, the flow tubes 202. Such an orientation provides greater heat removal from the panel 204 as compared to the longitudinal direction (indicated by the arrow 318) being oriented generally parallel with the flow tubes 202. The heat is conducted more readily along the longitudinal direction (indicated by the arrow 318) of the panel 204 and, thus, is conducted to a greater number of the flow tubes 202, resulting in a greater transfer rate of heat into the cooling fluid flowing through the flow tubes 202.

An upper surface 210 of the face sheet 204, as illustrated in FIGS. 1-3, may be coated with a protective layer 106 to reduce the likelihood of damaging the face sheet 204 during use. In one embodiment, the protective layer 106 comprises Resbond® 931 binder and sealer, manufactured by Cotronics Corporation of Brooklyn, N.Y. In another embodiment, the protective layer 106 may be made of an organic or inorganic thermally-conductive paint, e.g., Coverguard™, manufactured by ZYP Coatings, Inc. of Oak Ridge, Tenn. Alternatively, the protective layer 106 may be coating deposited on the upper surface 210 by a vacuum-metallizing process.

In use, a device or piece of equipment (not shown) may be placed on the upper surface 210 of the face sheet 204 (or on the protective layer 106, if present) so that the cold plate 100 may remove heat generated by the device. Heat emanating from the device transfers into the face sheet 204. The heat then transfers through the face sheet 204 and into the flow tubes 202. The heat then flows into the cooling fluid flowing through the flow tubes 202, whereby it is carried away to the heat exchanger (not shown in FIGS. 1-3).

While the cold plate 100 comprising the face sheet 204 and the flow tubes 202 provides desirable heat extraction capabilities, it may be desirable in some situations for the cold plate 100 to have additional structural strength, i.e., so that the cold plate 100 may be used as a shelf to hold the device. Accordingly, the cold plate 100, as illustrated in FIGS. 2 and 3, further comprises a structural member 214, adhesively bonded or otherwise attached to the face sheet 204, which provides additional structural strength to the cold plate 100. While the present invention is not so limited, the structural member 214 illustrated in FIGS. 2 and 3 comprises a core 216 adhesively bonded or otherwise attached between an upper skin 218 and a lower skin 220. The core 216 may be made of any core material known in the art, e.g., metallic or non-metallic honeycomb, open- or closed-cell foam, or the like. In one embodiment, the core 216 is made from aluminum honeycomb defining grooves 222 (only one indicated) in a pattern corresponding to that of the flow tubes 202. Further, the core 216 defines grooves 324 corresponding to the location of the manifolds 306, 310 at assembly.

Still referring to FIGS. 2 and 3, the upper skin 218 may be made of any suitably formable material, e.g., aluminum, a polymer-matrix composite material, or the like. In the illustrated embodiment, the upper skin 218 is made from a carbon-reinforced, epoxy-matrix composite material, e.g., Cycom™ epoxy matrix reinforced with T300 carbon fibers, manufactured by Cytec Industries, Inc. of West Paterson, N.J. The upper skin 218 defines a shape corresponding to the grooves 222, 324 in the core 216 such that, upon assembly, the upper skin 218 nests into the grooves 222, 324 and the flow tubes 202 and the manifolds 306, 310 nest in the upper skin 218. In the illustrated embodiment, the upper skin 218 is adhesively bonded to a lower surface 224 of the face sheet 204 but may be attached to the face sheet 204 by any desired means. The lower skin 220 may comprise any known material desirable as a skin for a structural member. In the illustrated embodiment, the lower skin 220 is also made from a carbon-reinforced, epoxy-matrix composite material, as described above in relation to the upper skin 218.

Figure 5:
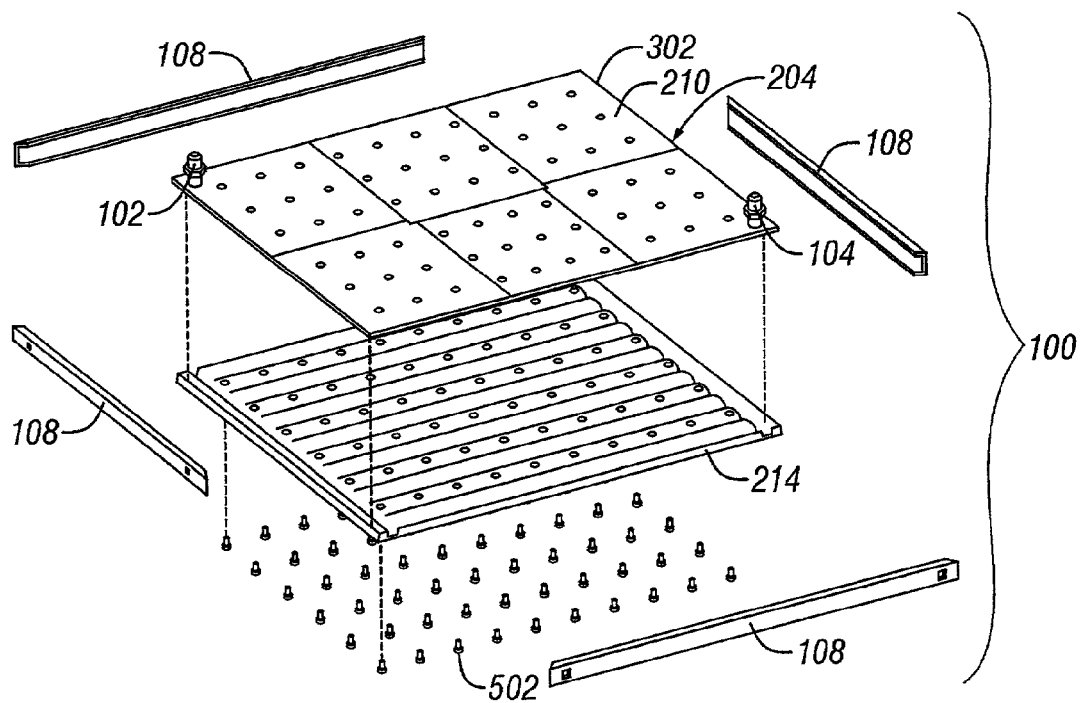
FIG. 5 is a partially exploded, perspective view of the cold plate of FIG. 1 further illustrating edge closeouts of the cold plate and an alternative way of fastening components of the cold plate.

In the embodiment illustrated in FIG. 5, the cold plate 100 includes a plurality of fasteners 502, each defining a threaded bore. An article to be cooled by the cold plate 100 may be fastened thereto by passing a screw (not shown) through a portion of the article and threadedly engaging the screw with the threaded bore of the fastener 502. The invention is not so limited, however, as any desired means may be used to attach the article to the cold plate 100.

The embodiment illustrated in FIGS. 1 and 5 further comprises a plurality of edge closeouts 108 attached to the face sheet 204 and the lower skin 220 (shown in FIG. 1). While the present invention is not so limited, the closeouts 108 in the illustrated embodiment are generally C-shaped in cross-section. The closeouts 108 may be adhesively bonded to the face sheet 204 and the lower skin 220 or may be mechanically fastened to the face sheet 204 and the lower skin 220. The closeouts 108 may be made of any desired material, such as aluminum, polymer-matrix composite, or the like.

Figure 6:
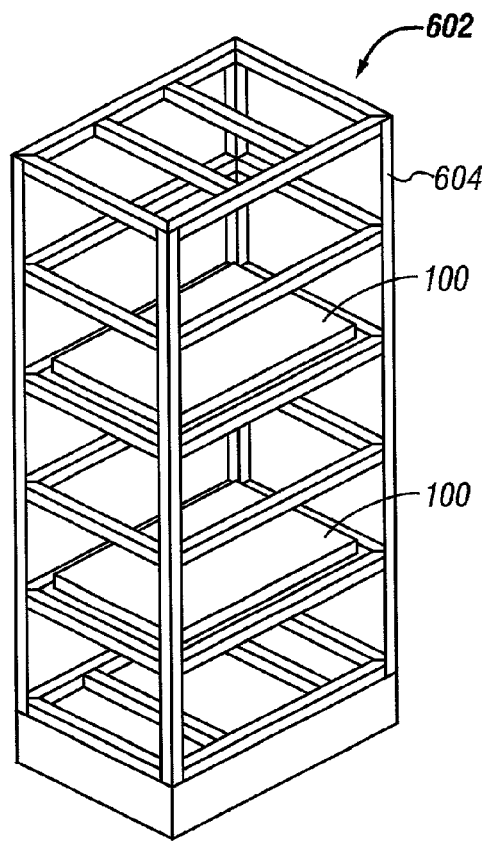
FIG. 6 is a stylized, perspective view of an equipment rack including the cold plate of FIG. 1.

As mentioned previously, it may be desirable for the cold plate 100 to be used to also structurally support a device from which heat is to be removed. Accordingly, FIG. 6 illustrates the cold plate 100 used as a shelf in an equipment rack 602, supported by a framework 604. The equipment rack 602 and the framework 604 may be of any types known in the art. Further, the scope of the present invention encompasses modifications to the cold plate 100 so that it may be adapted for use in the equipment rack 602.

Figure 7:
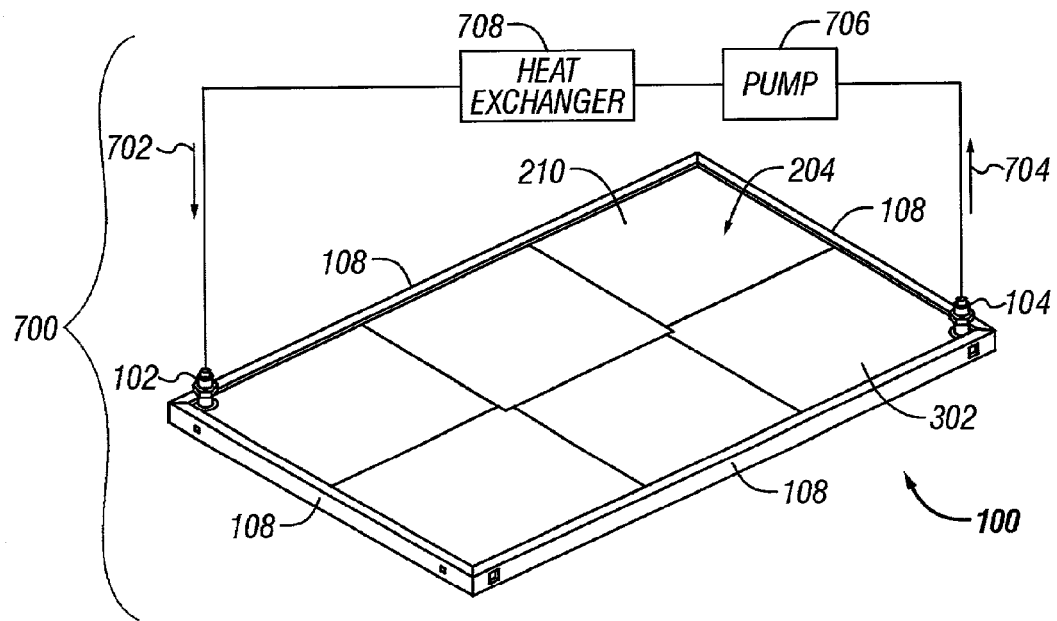
FIG. 7 is a stylized diagram of a heat extraction system according to the present invention.

A heat extraction system 700 according to the present invention is illustrated in FIG. 7. Cooling fluid may be pumped (as indicated by arrows 702, 704) by a pump 706 through the cold plate 100 to remove heat from the device or the equipment disposed on the upper surface 128 of the face sheet 204 (or disposed on the protective layer 106, if present) and through a heat exchanger 708 to remove heat from the cooling fluid. While, in the illustrated embodiment, the pump 706 is disposed between the heat exchanger 708 and the output fitting 104, the present invention also encompasses an embodiment wherein the pump 706 is disposed between the heat exchanger 708 and the input fitting 102.

This concludes the detailed description. The particular embodiments disclosed above are illustrative only, as the invention may be modified and practiced in different but equivalent manners apparent to those skilled in the art having the benefit of the teachings herein. Furthermore, no limitations are intended to the details of construction or design herein shown, other than as described in the claims below. It is therefore evident that the particular embodiments disclosed above may be altered or modified and all such variations are considered within the scope and spirit of the invention. In particular, every range of values (of the form, "from about a to about b," or, equivalently, "from approximately a to b," or, equivalently, "from approximately a-b") disclosed herein is to be understood as referring to the power set (the set of all subsets) of the respective range of values, in the sense of Georg Cantor. Accordingly, the protection sought herein is as set forth in the claims below.

What is claimed is:

1. An apparatus, comprising:
    a cold plate, comprising:
        a face sheet including a composite material and comprising:
            a plurality of joined panels; and
        at least one cooling tube capable of transmitting a cooling fluid therethrough attached to a lower surface of the face sheet.

2. The apparatus, according to claim 1, wherein the plurality of panels are joined by at least one soldered lap joint, at least one brazed lap joint, or at least on adhesively bonded lap joint.

3. The apparatus, according to claim 2, wherein the at least one soldered lap joint includes a, soldering material having a composition not exceeding about 93 percent tin by weight, about 6 percent silver by weight, and about 4.5 percent titanium by weight.

4. The apparatus, according to claim 1, wherein the composite material comprises:
    at least one of a carbon-carbon composite material and a metal encapsulated carbon material.

5. The apparatus, according to claim 1, further comprising:
    an input manifold to which the cooling tube is joined at a first end thereof; and an output manifold to which the cooling tube is joined at a second end thereof.

6. The apparatus according to claim 1, wherein the at least one flow tube comprises one of a 0-shape, an oval, a rectangle, and a rounded rectangle in cross-section.

7. The apparatus, according to claim 1, wherein the at least one flow tube is attached to the lower surface of the face sheet by a material selected from the group consisting of an adhesive bonding material, a soldering material, and a brazing material.

8. The apparatus, according to claim 7, wherein the soldering material comprises a composition not exceeding about 93 percent tin by weight, about 6 percent silver by weight, and about 4.5 percent titanium by weight.

9. The apparatus, according to claim 1, further comprising:
    a protective layer applied to an upper surface of the face sheet.

10. The apparatus, according to claim 1, further comprising:
    a structural member attached to the face sheet.

11. The apparatus, according to claim 10, wherein the structural member comprises:
    an upper skin attached to the lower surface of the face sheet;
    a lower skin; and
    a core attached between the upper skin and the lower skin.

12. The apparatus, according to claim 1, further comprising:
    a pump in fluid communication with the cold plate; and
    a heat exchanger in fluid communication with the pump and the cold plate.

13. The apparatus, according to claim 1, further comprising:
    a framework for holding the cold plate as a shelf.

14. An apparatus, comprising:
    a cold plate, comprising:
        a face sheet comprising a plurality of joined panels and including at least one of a carbon-carbon composite material and a metal-encapsulated carbon material: and
        at least one cooling tube capable of transmitting a cooling fluid therethrough attached to a lower surface of the face sheet.

15. The apparatus, according to claim 14, wherein the plurality of panels are joined by at least one soldered lap joint, at least one brazed lap joint, or at least one adhesively bonded lap joint.

16. The apparatus, according to claim 15, wherein the at least one soldered lap joint includes a soldering material having a composition not exceeding about 93 percent tin by weight, about 6 percent silver by weight, and about 4.5 percent titanium by weight.

17. The apparatus, according to claim 14, further comprising:
    an input manifold to which the cooling tube is joined at a first end thereof; and an output manifold to which the cooling tube is joined at a second end thereof.

18. The apparatus, according to claim 14, wherein the at least one flow tube comprises one of a 0-shape, an oval, a rectangle, and a rounded rectangle in cross-section.

19. The apparatus according to claim 14, wherein the at least one flow tube is attached to the lower surface of the face sheet by a material selected from the group consisting of an adhesive bonding material, a soldering material, and a brazing material.

20. The apparatus, according to claim 19, wherein the soldering material comprises a composition not exceeding about 93 percent tin by weight, about 6 percent silver by weight and about 4.5 percent titanium by weight.

21. The apparatus, according to claim 14, further comprising:
    a protective layer applied to an upper surface of the face sheet.

22. The apparatus, according to claim 14, further comprising:
    a structural member attached to the face sheet.

23. The apparatus according to claim 22, wherein the structural member comprises:
    an upper skin attached to the face sheet;
    a lower skin; and
    a core attached between the upper skin and the lower skin.

24. The apparatus according to claim 14, further comprising:
    a pump in fluid communication with the cold plate; and
    a heat exchanger in fluid communication with the pump and the cold plate.

25. The apparatus, according to claim 14, further comprising:
    a framework for holding the cold plate as a shelf.

26. An apparatus, comprising:
    a cold plate, comprising:
        a face sheet comprising a plurality of joined panels made from a composite material; and
        at least one cooling tube capable of transmitting a cooling fluid therethrough attached to a lower surface of the face sheet by a soldering material having a composition not exceeding about 93 percent tin by weight, about 6 percent silver by weight, and about 4.5 percent titanium by weight, the cooling tube being capable of transmitting a cooling fluid therethrough.

27. The apparatus, according to claim 26, wherein the plurality of panels are joined by at least one soldered lap joint, at least one brazed lap joint, or at least one adhesively bonded lap joint.

28. The apparatus, according to claim 27, wherein the at least one soldered lap joint includes a soldering material having a composition not exceeding about 93 percent tin by weight, about 6 percent silver by weight, and about 4.5 percent titanium by weight.

29. The apparatus, according to claim 26, further comprising:
an input manifold to which the cooling tube is joined at a first end thereof; and an output manifold to which the cooling tube is joined at a second end thereof.

30. The apparatus, according to claim 26, wherein the at least one flow tube comprises one of a D-shape, an oval, a rectangle, and a rounded rectangle in cross-section.

31. The apparatus, according to claim 26, further comprising:
a protective layer applied to an upper surface of the face sheet.

32. The apparatus, according to claim 26, further comprising:
a structural member attached to the face sheet.

33. The apparatus, according to claim 32, wherein the structural member comprises:
an upper skin attached to the lower surface of the face sheet;
a lower skin; and
a core attached between the upper skin and the lower skin.

34. The apparatus, according to claim 26, further comprising:
a pump in fluid communication with the cold plate; and
a heat exchanger in fluid communication with the pump and the cold plate.

35. The apparatus, according to claim 26, further comprising:
a framework for holding the cold plate as a shelf.

36. An apparatus, comprising:
a cold plate, comprising:
a face sheet including a composite material; and
at least one cooling tube capable of transmitting a cooling fluid therethrough attached to a lower surface of the face sheet, the at least one cooling tube defining a bore therethrough for transmitting the cooling fluid, the bore having a cross-sectional width-to-height ratio of about 3 to about 1.

37. The apparatus, according to claim 36, wherein the face sheet comprises:
a plurality of joined panels.

38. The apparatus, according to claim 37, wherein the plurality of panels are joined by at least one soldered lap joint, at least one brazed lap joint, or at least one adhesively bonded lap joint.

39. The apparatus, according to claim 38, wherein the at least one soldered lap joint includes a soldering material having a composition not exceeding about 93 percent tin by weight, about 6 percent silver by weight, and about 4.5 percent titanium by weight.

40. The apparatus according to claim 36, wherein the composite material comprises:
at least one of a carbon-carbon composite material and a metal-encapsulated carbon material.

41. The apparatus, according to claim 36, further comprising:
an input manifold to which the cooling tube is joined at a first end thereof; and an output manifold to which the cooling tube is joined at a second end thereof.

42. The apparatus, according to claim 36, wherein the at least one flow tube comprises one of a 0-shape, an oval, a rectangle, and a rounded rectangle in cross-section.

43. The apparatus, according to claim 36, wherein the at least one flow tube is attached to the lower surface of the face sheet by a material selected from the group consisting of an adhesive bonding material, a soldering material, and a brazing material.

44. The apparatus, according to claim 43, wherein the soldering material comprises a composition not exceeding about 93 percent tin by weight, about 6 percent silver by weight, and about 4.5 percent titanium by weight.

45. The apparatus, according to claim 36, further comprising:
a protective layer applied to an upper surface of the face sheet.

46. The apparatus, according to claim 36, further comprising:
a structural member attached to the face sheet.

47. The apparatus, according to claim 46, wherein the structural member comprises:
an upper skin attached to the lower surface of the face sheet;
a lower skin; and
a core attached between the upper skin and the lower skin.

48. The apparatus, according to claim 36, further comprising:
a pump in fluid communication with the cold plate; and
a heat exchanger in fluid communication with the pump and the cold plate.

49. The apparatus, according to claim 36, further comprising:
a framework for holding the cold plate as a shelf.

50. An apparatus comprising:
a cold plate, comprising:
a face sheet comprising a plurality of joined panels; and
at least one cooling tube capable of transmitting a cooling fluid therethrough attached to a lower surface of the face sheet by a soldering material having a composition not exceeding about 93 percent tin by weight, about 6 percent silver by weight, and about 4.5 percent titanium by weight, the cooling tube being capable of transmitting a cooling fluid therethrough; and
a structural member attached to the face sheet.

51. The apparatus according to claim 50 wherein the plurality of panels are joined by at least one soldered lap joint, at least one brazed lap joint, or at least one adhesively bonded lap joint.

52. The apparatus, according to claim 51, wherein the at least one soldered lap joint includes a soldering material having a composition not exceeding about 93 percent tin by weight, about 6 percent silver by weight, and about 4.5 percent titanium by weight.

53. The apparatus, according to claim 50, further comprising:
an input manifold to which the cooling tube is joined at a first end thereof; and an output manifold to which the cooling tube is joined at a second end thereof.

54. The apparatus, according to claim 50, wherein the at least one flow tube comprises one of a D-shape, an oval, a rectangle, and a rounded rectangle in cross-section.

55. The apparatus, according to claim 50, further comprising:
a protective layer applied to an upper surface of the face sheet.

56. The apparatus, according to claim 50, wherein the structural member comprises:
an upper skin attached to the lower surface of the face sheet;
a lower skin; and
a core attached between the upper skin and the lower skin.

57. The apparatus, according to claim 50, further comprising:
a pump in fluid communication with the cold plate; and a heat exchanger in fluid communication with the pump and the cold plate.

58. The apparatus, according to claim 50, further comprising:
a framework for holding the cold plate as a shelf.

59. An apparatus, comprising:
a cold plate, comprising:
a face sheet; and
at least one cooling tube attached to a lower surface of the face sheet, the at least one cooling tube defining a bore therethrough for transmitting a cooling fluid, the bore having a cross-sectional width-to-height aspect ratio of about 3 to about 1; and
a structural member attached to the face sheet.

60. The apparatus, according to claim 59, wherein the face sheet comprises:
a plurality of joined panels.

61. The apparatus, according to claim 60, wherein the plurality of panels are joined by at least one soldered lap joint, at least one brazed lap joint, or at least one adhesively bonded lap joint.

62. The apparatus, according to claim 61, wherein the at least one soldered lap joint includes a soldering material having a composition not exceeding about 93 percent tin by weight, about 6 percent silver by weight, and about 4.5 percent titanium by weight.

63. The apparatus, according to claim 59, further comprising:
an input manifold to which the cooling tube is joined at a first end thereof; and an output manifold to which the cooling tube is joined at a second end thereof.

64. The apparatus, according to claim 59, wherein the at least one flow tube comprises one of a 0-shape, an oval, a rectangle, and a rounded rectangle in cross-section.

65. The apparatus, according to claim 59, further comprising:
a protective layer applied to an upper surface of the face sheet.

66. The apparatus, according to claim 59, wherein the structural member comprises:
an upper skin attached to the lower surface of the face sheet;
a lower skin; and
a core attached between the upper skin and the lower skin.

67. The apparatus, according to claim 59, further comprising:
a pump in fluid communication with the cold plate; and
a heat exchanger in fluid communication with the pump and the cold plate.

68. The apparatus, according to claim 59, further comprising:
a framework for holding the cold plate as a shelf.

69. An apparatus, comprising:
a cold plate, comprising:
a face sheet; and
at least one cooling tube attached to a lower surface of the face sheet, the at least one cooling tube capable of transmitting a cooling fluid therethrough;
a structural member attached to the face sheet; and
a fastener defining a threaded bore, the fastener extending through the face sheet for attaching an article to the facesheet.

70. The apparatus, according to claim 69, wherein the face sheet comprises:
a plurality of joined panels.

71. The apparatus, according to claim 69, further comprising:
an input manifold to which the cooling tube is joined at a first end thereof; and an output manifold to which the cooling tube is joined at a second end thereof.

72. The apparatus, according to claim 69, wherein the at least one flow tube comprises one of a D-shape, an oval, a rectangle, and a rounded rectangle in cross-section.

73. The apparatus, according to claim 69, further comprising:
a protective layer applied to an upper surface of the face sheet.

74. The apparatus, according to claim 69, wherein the structural member comprises:
an upper skin attached to the face sheet;
a lower skin; and
a core attached between the upper skin and the lower skin.

75. The apparatus, according to claim 69, further comprising:
a pump in fluid communication with the cold plate; and
a heat exchanger in fluid communication with the pump and the cold plate.

76. The apparatus, according to claim 69, further comprising:
a framework for holding the cold plate as a shelf.

77. A method, comprising the steps of:
soldering, brazing, or adhesively bonding a plurality of panels to form a face sheet comprising a composite material; and
attaching at least one cooling tube to a lower surface of the face sheet;
wherein the step of soldering, brazing, or adhesively bonding the plurality of panels is accomplished by the step of soldering the plurality of panels at a temperature of about 232° C. to about 260° C. using a solder having a composition not exceeding about 93% tin by weight, about 6% silver by weight, and about 4.5% titanium by weight.

* * * * *